US007498392B2

(12) United States Patent
Nelson

(10) Patent No.: US 7,498,392 B2

(45) **Date of Patent: *Mar. 3, 2009**

(54) METHODS AND COMPOSITIONS FOR DIELECTRIC MATERIALS

(76) Inventor: Kevin G. Nelson, 408 Susquehanna Ave., West Pittston, PA (US) 18640

( * ) Notice: Subject to any disclaimer, the term of this patent is extended or adjusted under 35 U.S.C. 154(b) by 238 days.

This patent is subject to a terminal disclaimer.

(21) Appl. No.: 11/404,044

(22) Filed: Apr. 13, 2006

(65) Prior Publication Data

US 2006/0281864 A1 Dec. 14, 2006

Related U.S. Application Data

(63) Continuation-in-part of application No. 11/334,947, filed on Jan. 19, 2006, and a continuation-in-part of application No. PCT/US2006/002012, filed on Jan. 19, 2006.

(60) Provisional application No. 60/644,976, filed on Jan. 19, 2005.

(51) Int. Cl.
*B32B 27/16* (2006.01)
*C08F 114/26* (2006.01)

(52) U.S. Cl. ...................................... 526/250; 428/422

(58) Field of Classification Search ....................... None
See application file for complete search history.

(56) References Cited

U.S. PATENT DOCUMENTS

| | | | | |
|---|---|---|---|---|
| 5,427,831 | A | 6/1995 | Stevens | |
| 5,514,231 | A | 5/1996 | Thomas | |
| 5,569,488 | A | 10/1996 | Frankosky | |
| 5,604,017 | A | 2/1997 | Frankosky | |
| 5,658,670 | A | 8/1997 | Fukushi et al. | |
| 5,677,047 | A | 10/1997 | Thomas | |
| 5,916,659 | A | 6/1999 | Koerber et al. | |
| 5,965,273 | A | 10/1999 | Walpita et al. | |
| 6,306,503 | B1 | 10/2001 | Tsai | |
| 6,346,328 | B1 | 2/2002 | Parsonage et al. | |
| 6,683,255 | B2 | 1/2004 | Kolmschlag et al. | |
| 6,703,114 | B1 | 3/2004 | Guiles et al. | |
| 6,743,511 | B2 | 6/2004 | Dittrich et al. | |
| 2003/0011958 | A1 * | 1/2003 | Kolmschlag et al. | 361/302 |
| 2006/0210806 | A1 | 9/2006 | Nelson | |

OTHER PUBLICATIONS

International Search Report for PCT Application No. PCT/US2006/013967 dated May 8, 2008.

* cited by examiner

*Primary Examiner*—Ramsey Zacharia
(74) *Attorney, Agent, or Firm*—Troutman Sanders LLP

(57) ABSTRACT

The present invention comprises methods and compositions of dielectric materials. The dielectric materials of the present invention comprise materials having a dielectric constant of more than 1.0 and less than 1.9 and/or a dissipation factor of less than 0.0009. Other characteristics include the ability to withstand a wide range of temperatures, from both high temperatures of approximately +260° C. to low temperatures of approximately −200° C., operate in wide range of atmospheric conditions and pressures (e.g., a high atmosphere, low vacuum condition such as that found in the outer-space as well as conditions similar to those found at sea level or below sea level). The dielectric materials of the present invention may be used in the manufacture of composite structures that can be used alone or in combination with other materials, and can be used in electronic components or devices such as RF interconnects.

15 Claims, No Drawings

METHODS AND COMPOSITIONS FOR DIELECTRIC MATERIALS

RELATED APPLICATIONS

This application is a continuation in part of and claims the benefit of U.S. patent application Ser. No. 11/334,947, filed Jan. 19, 2006, which claims the benefit of U.S. Provisional Patent Application No. 60/644,976, and a continuation in part of PCT Application No. PCT/US2006/002012, filed Jan. 19, 2006. All of them are herein incorporated by reference in their entirety.

FIELD OF INVENTION

The present invention is directed to dielectric materials and methods of making and using such materials, particularly in laminate articles and assemblies comprising at least one dielectric material for circuit boards, insulators, radar microwave, RF interconnects, and other applications.

BACKGROUND OF THE INVENTION

Composite or laminate structures are the basis for many applications in the electronics industry. Advances in printed wiring board laminates have lead to faster, smaller, lighter and cost effective electronic components for use in applications such as radar, antennas, telephony, computer board components, wireless and cellular technology, RF interconnects, and microwave devices. The characteristics of the materials used to make the composites affect the technical abilities and applications for which the composite or laminate structure can be used.

A variety of composite structures are used in the electronics industry. Technical requirements for such composites include the structural integrity of the finished structure, the ability of the individual components to withstand the rigors of assembly, the ability of the assembled structure to withstand a variety of processing conditions, such as those used in making printed wired circuit board (including, e.g., the ability to withstand high temperature conditions as experienced during soldering operations and the ability to interconnect layers by means of plating through vias), the performance properties of the components used and the finished structure (including the dielectric constant, resistance to environmental conditions such as moisture, atmosphere, harsh chemicals, and heat), costs of the components, and costs associated with the manufacture of the finished article.

One component of a laminate is the dielectric material that is used. A dielectric material is an insulating material that does not conduct electrons easily and thus has the ability to store electrical energy when a potential difference exists across it. The stored energy is known as an electric potential or an electrostatic field which holds electrons. The electrons are discharged when the buildup of electrons is sufficiently large. Common dielectric materials include glass, mica, mineral oil, paper, paraffin, polystyrene, plastics, phenolics, epoxies, aramids, and porcelain. The characteristics of the dielectric are determined by the material from which it is made and its thickness.

In electronic circuits, dielectric materials may be employed in capacitors and as circuit board substrates. Conventionally, dielectric constant materials are used in radar or microwave applications and also for circuit miniaturization as the speed of propagation of signal at a constant frequency is proportional to the inverse of the square root of the dielectric constant of the medium through which it passes. Low dielectric constant materials are used for high speed, low loss transmission of signals as such materials allow faster signal propagation, and less space is required in circuitry design or in conductive layers. Low dielectric materials also have radar and microwave applications. If the combination of materials is such that the loss tangent for a material of a given frequency signal is very low, the circuit board will allow very efficient transmission or splitting of the signal without electrical loss related to the hysteresis loop. If a whole circuit were built on low dielectric material, one could amplify the signal only a certain amount at each mounted transistor, and because of the lower power involved, the assembly would reduce the build up of excessive heat and temperature. Consequently, the amplification would be spread over a large space. If all of the dielectric material had a high dielectric constant, there would be more loss at signal splits so that more transistors would be necessary to maintain a specific signal to noise ratio, and more power would be required to operate these components.

One of the common materials used in the production of printed circuit boards, which are used in antennas and other elements of cellular and wireless technology, is glass fiber and/or woven glass materials that are coated with PTFE (polytetrafluoroethylene), cyanate ester, Aramids, and/or PTFE films. These materials have been used because they can be manufactured readily. However, they are more expensive than many other higher dielectric printed circuit materials, and require multiple steps to manufacture. They are also relatively heavy due to its density of about 2.5 $gm/cm^3$. Furthermore, these materials generally have a dielectric constant no lower than about 2.17.

Efforts have been made to provide materials that are lighter and have lower dielectric constants. Such efforts include making a structure in which a microballoon-filled adhesive is used to bond metal foil directly to a rigid polyisocyanurate foam. While potentially useful in manufacturing individual antennas, the method is limited in that there is no true barrier to attack of the foam surface by process chemistries (both aqueous and organic) typical of printed wiring board manufacturing processes once the copper has been etched away. This results in degradation of and/or inconsistency in electrical properties and performance. Another known weakness with the polyisocyanurate foam is degradation when exposed to ultraviolet rays. Thus, this method cannot be used in the high volume continuous manufacturing necessary to produce a product economically.

Other problems also arise during the manufacturing process. For example, scientists have attempted to resolve the issue of degraded electrical performance by using a polyurethane film adhesive to bond copper foil directly to a rigid Baltek polystyrene foam core at 350° F. However, such treatment led to the partial structural collapse of the foam and did not result in an impermeable barrier between the copper and the foam. The resultant product had pinholes in the film/bonding layer, which resulted in the penetration of etch chemicals during processing. Another attempt was to coat the foam itself with a ceramic-filled resin system known to have good electrical properties. Again the foam collapsed due to heat and pressure, resulting in a material that was too dense and the seal between the copper and the foam was still inadequate to eliminate etchant penetration and entrapment in the foam structure. Other composites also have been investigated, such as polyethylene in closed and open cell forms. The results indicate that the material structure and integrity of the product was compromised in these studies. Many of these polyethylene and polystyrene foam materials also cannot survive processing required to plate connecting holes.

There is a need for a dielectric material that has at least one of the desirable characteristics, such as, a low dielectric constant, a low loss tangent, the ability to withstand a wide range of temperatures, the ability to operate in wide range of atmospheric conditions and pressures, and capable of being used in the manufacture of composite structures that can be used alone or in combination with other materials. Such completed assemblies could form electronic components used in electronic devices.

SUMMARY OF THE INVENTION

The present invention comprises methods and compositions for dielectric materials that are useful in laminate structures, components, or assemblies of multiple components that may be used in a variety of electronic applications. The dielectric materials of the present invention have low dielectric constant or low loss tangent, or both, can withstand a wide range of temperatures, from both high temperatures of approximately +260° C. to low temperatures of approximately −200° C., operate in a wide range of atmospheric conditions and pressures, e.g., a high atmosphere, low vacuum condition such as that found in the outer-space as well as conditions similar to those found at sea level, below sea level, or under-ground. These materials may further comprise a material that exhibits low moisture absorption, low x, y, z-axis coefficient of thermal expansion (CTE), good dimensional stability in the X and Y CTE, which may aid in the reliability of registration of through holes and which will also be stable when exposed to ultraviolet (UV) light; has a low tensile modulus; and may be used in the manufacture of composite structures that can be used alone or in combination with other materials, thus making the present invention suitable for use in a variety of electronic applications. The low CTE of the subject dielectric material, may increase the reliability of through hole connections and/or lessen any change in dielectric constant or loss tangent of the material when holes are plated through. In addition, the dielectric material, laminates made therefrom and assemblies incorporating such dielectric materials are resistant to attack by acidic aqueous media, basic aqueous media and/or organic media, making it possible to subject such assemblies to a variety of processing conditions commonly used in printed circuit board manufacturing, such as, for example, chemical etching to introduce circuitry thereto, as well as permitting operation in harsh environments of such articles incorporating the dielectric materials. The dielectric material of the present invention may also withstand manufacturing processes which may allow drilling, milling, etching, and plating of interconnecting holes or high temperature exposure while processing with hot-air-solder-leveling (HASL) or lamination of components.

Other features and advantages of the present invention will become apparent from the following detailed description. It should be understood, however, that the detailed description and the specific examples, while indicating the preferred embodiments of the present invention, are given by way of illustration only, since various changes and modifications within the spirit and scope of the present invention will become apparent to those skilled in the art from this detailed description.

DETAILED DESCRIPTION OF THE INVENTION

As used herein and in the appended claims, the singular forms "a," "an," and "the" include plural references, unless the content clearly dictates otherwise. Thus, for example, reference to "a dielectric material" includes a plurality of such dielectric materials and equivalents thereof known to those skilled in the art, and reference to "the pre-sintered PTFE resin" is a reference to one or more such pre-sintered PTFE resins and equivalents thereof known to those skilled in the art, and so forth. All publications, patent applications, patents, and other references mentioned herein are incorporated by reference in their entirety.

The present invention comprises methods and compositions for making and using materials having at least one of a low dielectric constant and a low loss tangent. The materials of the present invention can be used in harsh environments, which may have temperatures of approximately +260° C. to approximately −200° C., or may have wide ranges of atmospheric conditions and pressures, such as under high atmospheric pressures to near vacuum pressure, e.g., as those found at sea level, below sea level, or under-ground as well as in outer-space. The materials of the present invention may be used in the manufacture of composite structures that can be used alone or in combination with other materials. As used herein, the materials of the present invention are referred to as "low dielectric materials", but these materials are not limited to having only that characteristic, but may have one or all of the characteristics disclosed herein.

The low dielectric materials are useful as components of laminates, wherein the low dielectric material has one or more of its surfaces, or a portion of a surface, affixed or adjacent to another material, and are also useful as a component or components of assemblies, including combinations of multiple laminate structures, or where multiple layers of low dielectric materials are used. Such laminates and assemblies are used in electronic devices and applications. Electronic devices and applications include, but are not limited to, microstrip and stripline circuits, millimeter wave applications, military radar systems, missile guidance systems, point to point digital radio antennas, antennas, and other elements of cellular and wireless technology including, but not limited to, antennas for wireless communication systems, cellular base stations, LAN systems, automotive electronics, satellite TV receivers, microwave and RF components, radar systems, mobile communications systems, microwave test equipment, phase array antennas, ground based and airborne radar systems, power backplates, high reliability multilayer circuits, commercial airline collision avoidance systems, beam forming networks, airborne or other "friend or foe" identification systems, global positioning antennas and receivers, patch antennas, space saving circuitry, RF interconnects, and power amplifiers.

Technical requirements for materials used in high performance electronic devices and applications include glass transition temperatures, dielectric constant and loss tangent, dimensional stability, low coefficient of thermal expansion, high thermal conductivity, low z-direction expansion, have uncomplicated processing, and the ability to withstand complex and harsh chemical processing, allow plating of connecting holes, and withstand high temperatures used during hot-air-solder-leveling (HASL) or lamination of components. Different materials that make up the components of the laminates or assemblies are combined to reach specific technical requirements for the specific application. One of the materials more crucial in reaching the desired technical requirements is the dielectric material.

Many materials have been used in the electronics industry to provide dielectric materials. For example, dielectric materials made from woven or non-woven materials that are coated with resins are generally known in the art. An example of such dielectric material is woven or non-woven fiberglass, coated with polytetrafluoroethylene (PTFE) or filled PTFE.

Such fiberglass is commonly used in high performance microwave type printed wired boards. The dielectric constant of such coated fiber materials is reported to be 2.2 to 2.55 or higher if filled PTFE is used. Filled PTFE results from the addition of fillers such as ceramics, glass fibers, glass beads, carbon, graphite or molybdenum disulphide and other materials known to one skilled in the art to fill PTFE to alter certain properties of virgin PTFE.

The dielectric constant, also referred to as permittivity, Dk, Eps, or Er, is the property of a material that determines the relative speed that an electrical signal will travel in that material. The relative dielectric constant $\in_r$ (represented as κ or K in some cases) is defined as the ratio:

$$\in_r = \in_s / \in_0$$

where $\in_s$ is the static permittivity of the material in question, and $\in_0$ is the vacuum permittivity. This permittivity of free space is derived from Maxwell's equations by relating the electric field intensity E to the electric flux density D. In vacuum (free space), the permittivity $\in$ is just $\in_0$, so the dielectric constant is unity. Signal speed is roughly inversely proportional to the square root of the dielectric constant. A low dielectric constant will result in a high signal propagation speed and a high dielectric constant will result in a much slower signal propagation speed.

A related characteristic is the impedance of a laminate structure, such as a printed circuit board. The impedance is determined by the thickness of the laminate, which is the spacing between copper layers, and its dielectric constant. Impedance control, and impedance matching of critical linked functional modules, is especially important in high speed devices and applications. Thus, a feature of such laminates and assemblies is determined by the dielectric constant of the dielectric material and the thickness and width of the metal conductor (e.g., without limitation, copper, silver, gold, nickel, brass, and aluminum).

Related to dielectric constant (or permittivity) is dissipation factor, also known as, e.g., loss, loss tangent, LT, tan beta, and tan d. This is a measure of the percentage of the total transmitted power that will be lost as power dissipates into the laminate material. Prior to the present invention, the PTFE-glass materials, PTFE materials, and PTFE materials filled with other materials such as, but not limited to, ceramics that have dielectric constants as low as 2.1, may have dissipation factor measurements or loss as low as 0.0009 and are some of the preferred materials for wide commercial uses for high speed, high frequency applications including applications ranging in frequency from about 1 MHz to about 100 Ghz or higher.

Dielectric constants and dissipation factors are considered in making and designing electronic components, for example, for high speed digital and microwave applications. The low dielectric constant and/or low loss is important for materials handling high frequency, high volume digital data. These technical characteristics of dielectric constant or dissipation factor also relate to impedance control, which is also a factor considered when selecting materials for manufacturing high speed, high volume digital data transmission devices.

The dielectric materials of the present invention comprise materials that may have at least one of a low dielectric constant and a low dissipation factor, and optionally, may withstand a wide range of temperatures, from both high temperatures of about +260° C. to low temperatures of about −200° C., and may operate in a wide range of atmospheric conditions and pressures, e.g., a high atmosphere, low vacuum condition such as that found in the outer-space as well as conditions similar to those found at sea level or below sea level, as well as exposure to UV light. The material may optionally exhibit low moisture absorption, low x, y, z-axis coefficient of thermal expansion (CTE) which may increase the reliability of through hole connections or have less change in dielectric constant or loss tangent of the material, good dimensional stability in the X and Y CTE which may aid in the reliability of registration of through holes, and a low tensile modulus, or when combined with other composite materials, result in laminates or assemblies having improved impedance control. The dielectric material of the present invention may also withstand various manufacturing processes and may allow drilling, milling, etching, and/or plating of interconnecting holes or high temperature exposure while processing with hot-air-solder-leveling (HASL) or lamination of components.

In one aspect, the present invention provides a dielectric material comprising a dielectric constant of greater than about 1.0 and less than at least about 1.9, less than about 1.8, less than about 1.7, less than about 1.6, less than about 1.5, less than about 1.4, less than about 1.3, less than about 1.2, and less than about 1.1. The dielectric material may have a dielectric constant within the ranges between about 1.0 and the dielectric constant of PTFE. In one embodiment, the dielectric material of the present invention comprises a dissipation factor or loss of less than about 0.0009. In another embodiment, the present invention provides a dielectric material comprising a dielectric constant of greater than about 1.0 and less than at least about 1.9, and a loss of less than about 0.0009. In addition, the present invention provides PTFE dielectric materials for which the dielectric constant may be controlled by manufacturing steps to be a specific dielectric constant number or within a small range around a specific dielectric constant number that is grater than about 1.0 and less than at least about 1.9.

An embodiment of the dielectric materials of the present invention comprises a PTFE material that may be manufactured to have a particular characteristic such as a specific dielectric constant and/or loss tangent. Such dielectric materials may comprise microporous polymeric material, such as, without limitation, reduced density PTFE, and optionally having a controlled void volume and density. Exemplary embodiments of the dielectric materials of the present invention include, without limitation, PTFE alone and PTFE in combination with other materials such as PTFE filled materials, PTFE film, PTFE coated glass fibers or fabric. PTFE materials are known to those skilled in the art. Examples of conventional fillers for PTFE include, without limitation, glass fibers, glass spheres, carbon, graphite, bronze, stainless steel, and molybdenum disulfide. Polymeric fillers may also be used.

In another aspect, the present invention provides methods of making dielectric materials wherein the dielectric constant may be determined by the effects of the pre-sintering process, the ratio of the sintered resin to virgin resin, and the amount of pressure applied during molding. In various embodiments, methods of making dielectric materials comprise: a) pre-sintering micron sized PTFE resin or filled PTFE resin; b) blending a predetermined ratio of pre-sintered PTFE resin or pre-sintered filled PTFE resin with un-sintered PTFE resin (also referred to herein as virgin PTFE resin or filled virgin PTFE resin); c) molding mixture of pre-sintered/un-sintered PTFE resin or filled PTFE resin under controlled pressure to control the density of the material and thereby forming a molded PTFE article; d) sintering the molded PTFE article; and e) optionally skiving the molded PTFE article.

Sintering is the consolidation and densification of molded polytetrafluoroethylene above its melting temperature. Typically, the sintering temperature for PTFE is within the range of 350° C. to 400° C. Before it is sintered, a PTFE preform, or un-sintered but molded part, is relatively soft and can be easily broken with a minimal applied force. After sintering, the molded part may become much harder, tougher, and more resilient.

In one embodiment, the present invention provides a reduced density PTFE which can be made by controlled pre-sintering of powders with a defined particle size. For example, the PTFE of the present invention can be made with PTFE particles of from about 10 microns to about 300 microns, with a D50max of about 100, or other known and available PTFE resins. Methods for making PTFE films are known and generally include placing the PTFE resin particles and/or pre-sintered PTFE particles in a conventional or isostatic mold under pressure and further sintering the preformed billet to form a product material which may then be skived to form a film. The molding may include preformed molding, isostatic molding, or molding into a sheet or shape. The particles may or may not be pre-sintered prior to molding.

Many factors may affect the physical properties of the resulting dielectric material, such as, without limitation, the particle size of PTFE and/or any added fillers or other materials, pre-sintering temperature and time cycles, the ratio of pre-sintered PTFE to un-sintered PTFE resin, the molding pressure and final sintering temperature, and the inclusion or exclusion of fillers. Selection of such manufacturing steps may be dependent on the needs of the final article, composite or laminate.

For example, factors that affect the dielectric constant and the dissipation factor of the dielectric materials of the present invention may include the following. The dielectric constant and the dissipation factor may increase or decrease by the amount of pre-sintering of the PTFE, by varying molding pressure, and the time and temperature of the sintering cycle. A method of the present invention comprises making dielectric materials having a low dielectric constant that is greater than about 1.0 and less than at least about 1.9, wherein the PTFE resin is pre-sintered and then molded at a specific pressure and further sintered for a period of time that is effective to yield the desired dielectric constant. Sintering or pre-sintering may be carried out in ovens at about 350° C. to about 450° C., for about 10 minutes to about 10 hours. In general, the more pre-sintering the PTFE undergoes and the higher the ratio of pre-sintered to virgin PTFE, the lower the dielectric constant the final dielectric material may have.

In one embodiment, the dielectric constant of the desired product may be controlled by changing the ratio of pre-sintered PTFE to un-sintered PTFE. The un-sintered or virgin PTFE may be the same size range or a different size range as the pre-sintered PTFE. For example, the un-sintered or virgin PTFE may be from about 0.15 to about 350 microns, from about 20 to about 350 microns, from about 15 to about 30 microns, or may have a D50max of 5 microns, of 20 microns, of 50 microns or other known and available ranges. The ratio may be from about 99.9:1 to about 0.1:99.9 pre-sintered PTFE:un-sintered PTFE, such as, about 50:50, about 75:25, about 85:15, about 95:5, about 25:75, about 15:85, about 5:95, about 60:40, about 70:30, about 90:10, about 80:20, and all suitable ratios in between. In general, the more pre-sintered PTFE in the ratio, the lower the dielectric constant the final dielectric material may have.

In another embodiment, the dielectric constant of the desired product may be controlled by manipulating the mold pressure. The molding of the PTFE can be in any known molding means, including, but not limited to, billeting, molding, rolling, calendering, or isostatic molding wherein the pressures may be from about 0.5 $Kg/cm^2$ to about 1000 $Kg/cm^2$, about 0.5 $Kg/cm^2$ to about 100 $Kg/cm^2$, from about 50 $Kg/cm^2$ to about 500 $Kg/cm^2$, from about 100 $Kg/cm^2$ to about 300 $Kg/cm^2$, from about 200 $Kg/cm^2$ to about 1000 $Kg/cm^2$, from about 25 $Kg/cm^2$ to about 200 $Kg/cm^2$, from about 500 $Kg/cm^2$ to about 1000 $Kg/cm^2$, or any suitable pressures in between. In general, the lower molding pressure, the lower the density of the finished product, resulting in a lower the dielectric constant and loss tangent.

A factor that may determine the above factors is the requirements of the final product and the desired physical properties of the final product. For example, after molding, the dielectric material may be skived and may have to have the physical integrity to be skived. Thus molding pressure may have to be increased so that the material is sufficiently strong, other factors would need to be adjusted to keep the dielectric constant at the desired low number. It is the cumulative nature of the properties and the interaction of factors that allows for the adjustments in the factors to reach the desired predetermined low dielectric constant in the dielectric materials. For example, having a higher ratio of virgin PTFE allows for greater physical integrity in the finished dielectric material, but also a higher dielectric constant than a material made with a lower ratio of virgin PTFE.

The dielectric materials of the present invention, having a dielectric constant of more than about 1.0 and less than about 1.9 and/or a loss of less than 0.0009, may be used in composite assemblies. The dielectric material may be used in an individual layer form, may be covered on one or more surfaces by a polymeric film or membrane, such as, without limitation, PFA (perfluoroalkoxy), ECTFE (ethylene chlorotrifluoroethylene), or FEP (fluoroethylene propylene), or adhesives, or may be used as part of multiple layers of dielectric materials of the same or different types of polymeric materials. Any of these dielectric material combinations may be used alone or in combination with one or more layers of conductive material, such as, without limitation, about 17 to about 70 μm rolled or electrodeposited copper, copper foil, aluminum, brass, silver, gold, platinum, or other conductive materials applied directly or indirectly on the dielectric material, or other conductors to form assemblies such as circuit boards.

The thickness of the dielectric layer can vary widely, depending on the application. For example, a layer of the dielectric material may range in thickness from about 0.00001 mm to about 100 mm or greater. Those of skill in the art can readily determine suitable thickness of the dielectric material needed, depending on the end use intended for the resulting assembly.

The size of the void volume of the reduced density PTFE polymeric dielectric material of the present invention can be controlled and may vary, for example, according to the purpose of the application. The void volume of the dielectric material relates to the density of the polymeric dielectric material. The void volume may correlate with Dk and Df properties in an inverse relationship. The void volume of the materials of the present invention may range from about 5% to about 85% and may have a density ranging from about 0.6 to about 1.9 $g/cm^3$. The preferred void volume and density may vary and can be controlled, depending on the end use intended for the dielectric material or the assembly made therefrom. For example, in various embodiments, when one or more through-holes are drilled through or partially through an assembly, an open cell material with less void volume may be preferred.

An example of an assembly of the present invention comprises a layer of the dielectric material of the invention as described above, in combination with at least a second layer of material. For example a laminate may comprise a first layer of a conductive material in contact with a layer of the dielectric material of the present invention having at least one of a dielectric constant of more than about 1.0 and less than about 1.9 and a loss tangent of less than about 0.0009. Optionally, the dielectric layer may be in contact with one or more layers of a conductive material. Such a construct may comprise sandwiching the dielectric material between additional polymeric layers as well as the conductive layers. A laminate may also include other layers, such as a layer of material that is hydrophobic and impervious to other chemicals used in manufacture of circuits. Such a hydrophobic layer may be placed between a dielectric layer and one or more of the conductive layers. The layers may be attached to one another by methods known to those skilled in the art, including, but not limited to, adhesive means or using cofluoropolymers such as FEP or other polymers as an adhesive layer. Assemblies of the present invention also contemplate combinations of multiple layered structures. An example of an assembly is a printed circuit board or a printed wire board.

Conductive layers contemplated for use in the practice of the present invention may be typically electrically conductive, although non-conductive and/or semi-conductive materials may also be employed in the practice of the present invention. Exemplary electrically conductive layers include, without limitation, copper or an alloy thereof, nickel or an alloy thereof, nickel or nickel alloy plated copper, rolled copper-invar-copper, aluminum, and combinations thereof. Such conductive layers may cover the entire surface of the dielectric material of the present invention, or may also be narrow or defined conductive patterns as would be known to those in the art as lines, circuits, pathways, conductors, or vias.

For example, the first electrically conductive layer may be copper or an alloy thereof. Similarly, the optional second electrically conductive layer may be copper or an alloy thereof, a different conductive material, or a conductive layer comprising a non-conductive and/or semi-conductive material.

An aspect of the present invention comprises an assembly wherein the first electrically conductive layer is capable of being converted into frequency dependent circuitry. This may be accomplished by employing standard techniques known in the art. An aspect of the present invention is that an assembly can be subjected to conventional processing conditions for the preparation of circuitry thereon. Further, the second electrically conductive layer may be formed into a second frequency dependent circuit element, or it may be left intact to define a ground plane. This also can be prepared employing standard techniques known in the art.

The dielectric materials contemplated for use in the practice of the present invention, including but not limited to reduced density PTFE, may be resistant to such exposure as acidic aqueous media, basic aqueous media, and/or organic media such as those typical used in the manufacture of etched printed circuits. Such materials may be hydrophilic or hydrophobic. As readily recognized by those skilled in the art, a variety of media are commonly employed for the preparation and processing of electronic circuitry. Such media include, for example, acidic aqueous media (which embraces aqueous solutions having a pH of less than 7, to a pH of about 1 or less), basic aqueous media (which embraces aqueous solutions having a pH of greater than 7, to about 13 or higher), and organic media (which embraces non-polar organic solvents such as hydrocarbons, aromatics, and the like, polar organic solvents such as esters, halogenated hydrocarbons, and the like). The hydrophobic nature of the material can be made hydrophilic by exposure to sodium based chemicals such as FluoroEtch®, sodium ammonia, gases such as helium, nitrogen, or hydrogen, or plasma-energized gasses.

The dielectric materials and assemblies taught herein may be used in any electronic device or component. Applications include, without limitation, high frequency applications where low loss and controlled dielectric constant are required, such, but not limited to filters, couplers, low noise amplifiers, power dividers, and combiners, and applications for low cost, light weight printed circuits are used, such as printed circuit antennas for cellular infrastructure, automotive radar and other microwave and RF applications. Electronic components or devices include, without limitations, precision instrumentation, electronic components and computer applications of all types, and applications including, but not limited to, circuitry components for electronic applications, telephony, radiofrequencies, microwave or other signal transmission in computers, telephones, electronic devices and components used in engines, automobiles, space craft, marine craft, medical equipments, pipelines, and transmission and monitoring devices, including but not limited to, microstrip and stripline circuits, millimeter wave applications, military radar systems, missile guidance systems, point to point digital radio antennas, antennas, and other elements of cellular and wireless technology including, but not limited to, antennas for wireless communication systems, cellular base stations, LAN systems, automotive electronics, satellite TV receivers, microwave and RF components, radar systems, mobile communications systems, microwave test equipment, phase array antennas, ground based and airborne radar systems, power backplates, high reliability multilayer circuits, commercial airline collision avoidance systems, beam forming networks, airborne or other "friend or foe" identification systems, global positioning antennas and receivers, patch antennas, RF interconnects, space saving circuitry, and power amplifiers. The dielectric material of the present invention provides for electronic components or devices having lower impedance than is currently available because of the low dielectric constant or the low loss factor or both of the dielectric material. The dielectric material of the present invention is particularly suited to applications wherein closed cell polymeric foams are not suited.

In another aspect, the present invention provides methods for the production of multiple circuits on a single large sheet of invention assembly. This may be accomplished by creating a plurality of circuits by a so-called "Step and Repeat" photo imaging process on the first conductive layer of an invention assembly.

As readily recognized by those of skill in the art, assemblies can be applied to any of a variety of substrates for use. For example, circuits produced employing assemblies can be mounted on support structures, such as aluminum or composite materials intended as stiffeners, or the like, or can be combined with covers that act as protection from weather, for instance.

In various embodiments, one of the characteristics of the dielectric material of the present invention is the ability to withstand high temperatures that may be experienced during the fabrication of circuitry using processes like solder coating or hot-air-solder-leveling (HASL) which is used by those skilled in the art during circuit fabrication.

The dielectric material described in this invention may also have the ability to allow interconnection of conductive layers by means of drilling through hole interconnects as readily recognized by those skilled in the art. Such interconnects can be made through a single layer of the dielectric material, or in combination with other conductive or insulative layers. The method of creating the interconnecting holes include, without limitation, drilling, plunging, boring, or by means of a laser or any other known method to attach to connective layers on either side of the dielectric material or other conductive layers, as readily recognized by those skilled in the art. After drilling through holes in an assembly, the hydrophobic nature of the dielectric material can be made hydrophilic by exposure to sodium based chemical such as FluoroEtch®, or gases such as helium, nitrogen, or hydrogen, or by means of gasses ignited with plasma energy in order to plate the through holes with a conductor such as copper.

In accordance with yet another aspect of the present invention, there are provided multilayer assemblies comprising a plurality of the above-described assemblies of the invention. As readily recognized by those of skill in the art, a "plurality" of assemblies refers to, without limitation, stacking 2 up to or greater than about 20 assemblies to produce complex interconnected circuitry, or any combination of pluralities of the above-described assemblies and other conductive, non conductive, insulative, or support type materials.

In one aspect, the present invention provides a PTFE material, which comprises at least one of a dielectric constant of more than about 1.0 and less than about 1.9, and a loss tangent of less than about 0.0009. In one embodiment, the PTFE material may operate at a temperature from about −200° C. to about +260° C. In another embodiment, the PTFE material may operate at a condition, such as, without limitation, an under-water condition, an under-ground condition, an atmospheric condition, an outer-space condition, or a condition wherein the low dielectric constant PTFE material may be subject to ultraviolet light exposure. In yet another embodiment, the PTFE material of the present invention may operate at a pressure from a near vacuum pressure to a high pressure, wherein the near vacuum pressure may be a pressure found in an outer-space condition, and wherein the high pressure may be a pressure found in an under-water or an under-ground condition. In still another embodiment, the PTFE material of the present invention may operate after at least one of a physical treatment and a chemical treatment, including, without limitation, a mechanical treatment, hole-drilling, a heat treatment, lamination, bonding, plating, hot-air-solder-leveling, an acidic aqueous media treatment, a basic aqueous media treatment, or an organic media treatment. Also provided are a PTFE material comprising a dielectric constant of more than about 1.0 and less than about 1.9, a PTFE material comprising a loss tangent of less than about 0.0009, and a PTFE material, comprising a dielectric constant of more than about 1.0 and less than about 1.9 and a loss tangent of less than about 0.0009.

In another aspect, the present invention provides an article of manufacture, which comprises a PTFE material, wherein the PTFE material comprises at least one of a dielectric constant of more than about 1.0 and less than about 1.9, and a loss tangent of less than about 0.0009. Examples of the article of manufacture include, without limitation, an assembly, a laminate, a combination of multiple laminate structures, an electronic device, a circuit, a microstrip circuit, a multilayer circuit, a space saving circuitry, a stripline circuit, a millimeter wave system, a radar system, a ground based radar system, an airborne radar system, a missile guidance system, an antenna, a patch antenna, a point to point digital radio antenna, a phase array antenna, a cellular device, a cellular base station, a wireless device, a mobile communications system, a LAN system, an automotive electronic article, a satellite TV receiver, a computer, a telephone, a microwave, a microwave test equipment, a RF component, a RF interconnect, a power backplate, a commercial airline collision avoidance system, a beam forming network, an airborne identification system, a "friend or foe" identification system, a global positioning antenna, a global positioning receiver, a filter, a coupler, a low noise amplifier, a power divider, a combiner, a power amplifier, an automobile, a space craft, a marine craft, a medical equipment, a pipeline, a transmission device, or a monitoring device.

In yet another aspect, the present invention provides a PTFE material, which comprises at least one of a dielectric constant of more than about 1.0 and less than about 1.9, and a loss tangent of less than about 0.0009, wherein the PTFE material is obtained in accordance with a method comprising: (1) sintering a plurality of micron sized PTFE resins, thereby obtaining a sintered PTFE material; (2) mixing a plurality of un-sintered micron sized PTFE resins with the sintered PTFE material at a predetermined ratio, thereby obtaining a PTFE mixture; and (3) molding the PTFE mixture, thereby obtaining the PTFE material. In one embodiment, the method may further comprise a step of skiving the PTFE material of step c), a step of sintering the PTFE material of step c), or the combination thereof. In another embodiment, at least one of the plurality of micron sized PTFE resins and the plurality of un-sintered micron sized PTFE resins may comprise a filler or a filled PTFE resin. In yet another embodiment, the PTFE material of the present invention may operate at a temperature from about −200° C. to about +260° C. In still another embodiment, the PTFE material of the present invention may operate at a condition, such as, without limitation, an under-water condition, an under-ground condition, an atmospheric condition, an outer-space condition, or a condition wherein the low dielectric constant PTFE material may be subject to ultraviolet light exposure. In addition, the PTFE material of the present invention may operate at a pressure from a near vacuum pressure to a high pressure, wherein the near vacuum pressure may be a pressure found in an outer-space condition, and wherein the high pressure may be a pressure found in an under-water or an under-ground condition. The PTFE material of the present invention may also operate after at least one of a physical treatment and a chemical treatment, including, without limitation, a mechanical treatment, hole-drilling, a heat treatment, lamination, bonding, plating, hot-air-solder-leveling, an acidic aqueous media treatment, a basic aqueous media treatment, or an organic media treatment.

Also provided is a method for making a PTFE material, comprising: (1) sintering a plurality of micron sized PTFE resins, thereby obtaining a sintered PTFE material; (2) mixing a plurality of un-sintered micron sized PTFE resins with the sintered PTFE material at a predetermined ratio, thereby obtaining a PTFE mixture; and (3) molding the PTFE mixture, thereby obtaining the PTFE material. In one embodiment, the method further comprises a step of skiving the PTFE material of step c), a step of sintering the PTFE material of step c), or the combination thereof.

EXAMPLES

Example 1

Making a Dielectric Material

PTFE with a D50 max 100 is sintered for 30 minutes in an oven at 375° C. The pre-sintered PTFE has in a 90:10 ratio with virgin PTFE and placed in a billet mold. The billet is molded at a pressure of 200 $kg/cm^2$. The molded article is then sintered for 8 hours at 350° C. The sintered, molded articled is skived. The skived article will have a density of 1.4 gm/cm$^3$and the dielectric constant is 1.5±0.2. The article formed a flat film-like article that skived well and maintained its physical integrity. The dielectric material could be used in circuit boards, insulators, radar, microwave, RF interconnects components or other applications.

Example 2

Method for Making a Dielectric Material 200 micron PTFE with a filler of 5 percent glass fiber, with a D50 max of 50 is pre-sintered for 90 minutes in an oven at 390° C. The pre-sintered filled PTFE has a ratio of 85:15to virgin PTFE and placed into a flat mold at a thickness of 0.050". The mold is pressed at a pressure of 300 kg/cm$^2$. The molded article is sintered for 3 hours at 350° C. The finished article is tested and has a dielectric constant of 1.85+/−0.15 and a density of 1.75 gm/cm$^3$. The dielectric material could be used in circuit boards, insulators, RF interconnects, radar microwave, components or other applications.

Example 3

Molding a Shaped Dielectric Material 170 micron PTFE with a filler of 15 percent ceramic, with a D50 max of 20 is pre-sintered at 400° C. in an oven for 60 minutes. The pre-sintered filled PTFE has a ratio of 45:55 to virgin PTFE. The material is pressed in a cone-shaped mold at a pressure of 900 kg/cm$^2$. The molded part is sintered for 10 hours at a temperature of 365° C. The molded part is tested and has a dielectric constant of 1.7+/−0.2 and a density of 1.65 gm/cm$^3$. The dielectric material could be used in antennas, RF interconnects, or radar systems.

Whereas this invention has been described in detail with particular reference to preferred embodiments, it is understood that variations and modifications can be effected within the spirit and scope of the invention, as described herein before and as defined in the appended claims. The corresponding structures, materials, acts, and equivalents of all means plus function elements, if any, in the claims below are intended to include any structure, material, or acts for performing the functions in combination with other claimed elements as specifically claimed.

What is claimed is:

1. A polytetrafluoroethylene (PTFE) material, comprising a mixture of at least sintered PTFE resin, which is sintered prior to mixing, and un-sintered PTFE resin, wherein the material comprises at least one of a dielectric constant of more than about 1.0 and less than about 1.9, and a loss tangent of less than about 0.0009.

2. The PTFE material of claim 1, wherein the PTFE material operates at a temperature from about −200° C. to about +260° C.

3. The PTFE material of claim 1, wherein the PTFE material operates at a condition, wherein the condition is an under-water condition, an under-ground condition, an atmospheric condition, an outer-space condition, or a condition wherein the low dielectric constant PTFE material is subject to ultraviolet light exposure.

4. The PTFE material of claim 1, wherein the PTFE material operates at a pressure from a near vacuum pressure to a high pressure, wherein the near vacuum pressure is a pressure found in an outer-space condition, and wherein the high pressure is a pressure found in an under-water or an under-ground condition.

5. The PTFE material of claim 1, wherein the PTFE material operates after at least one of a physical treatment and a chemical treatment.

6. The PTFE material of claim 5, wherein one of the at least one of a physical treatment and a chemical treatment is a mechanical treatment, hole-drilling, a heat treatment, lamination, bonding, plating, hot-air-solder-leveling, an acidic aqueous media treatment, a basic aqueous media treatment, or an organic media treatment.

7. The PTFE material of claim 1, wherein the PTFE material is comprised in an assembly, a laminate, a combination of multiple laminate structures, an electronic device, a circuit, a microstrip circuit, a multilayer circuit, a space saving circuitry, a stripline circuit, a millimeter wave system, a radar system, a ground based radar system, an airborne radar system, a missile guidance system, an antenna, a patch antenna, a point to point digital radio antenna, a phase array antenna, a cellular device, a cellular base station, a wireless device, a mobile communications system, a LAN system, an automotive electronic article, a satellite TV receiver, a computer, a telephone, a microwave, a microwave test equipment, a RF component, a RF interconnect, a power backplate, a commercial airline collision avoidance system, a beam forming network, an airborne identification system, a "friend or foe" identification system, a global positioning antenna, a global positioning receiver, a filter, a coupler, a low noise amplifier, a power divider, a combiner, a power amplifier, an automobile, a space craft, a marine craft, a medical equipment, a pipeline, a transmission device, or a monitoring device.

8. A PTFE material, comprising a mixture of at least sintered PTFE resin and un-sintered PTFE resin having at least one of a dielectric constant of more than about 1.0 and less than about 1.9, and a loss tangent of less than about 0.0009, wherein the PTFE material is obtained in accordance with a method comprising, a) sintering a plurality of micron sized PTFE resins, thereby obtaining a sintered PTFE resin;

b) mixing a plurality of un-sintered micron sized PTFE resins with the sintered PTFE resin at a predetermined ratio, thereby obtaining a PTFE mixture; and c) molding the PTFE mixture, thereby obtaining the PTFE material.

9. The PTFE material of claim 8, further comprising a step of skiving the PTFE material of step c), a step of sintering the PTFE material of step c), or the combination Thereof.

10. The PTFE material of claim 8, wherein at least one of the plurality of micron sized PTFE resins and the plurality of un-sintered micron sized PTFE resins comprises a filler or a filled PTFE resin.

11. The PTFE material of claim 8, wherein the PTFE material operates at a temperature from about −200° C. to about +260° C.

12. The PTFE material of claim 8, wherein the PTFE material operates at a condition, wherein the condition is an under-water condition, an under-ground condition, an atmospheric condition, an outer-space condition, or a condition wherein the PTFE material is subject to ultraviolet light exposure.

13. The PTFE material of claim 8, wherein the PTFE material operates at a pressure from a near vacuum pressure to a high pressure, wherein the near vacuum pressure is a pressure found in an outer-space condition, and wherein the high pressure is a pressure found in an under-water or an under-ground condition.

14. The PTFE material of claim 8, wherein the PTFE material operates after at least one of a physical treatment and a chemical treatment.

15. The PTFE material of claim 7, wherein the PTFE material is comprised in an assembly, a laminate, a combination of multiple laminate structures, an electronic device, a circuit, a microstrip circuit, a multilayer circuit, a space saving circuitry, a stripline circuit, a millimeter wave system, a radar system, a ground based radar system, an airborne radar system, a missile guidance system, an antenna, a patch antenna, a point to point digital radio antenna, a phase array antenna, a cellular device, a cellular base station, a wireless device, a mobile communications system, a LAN system, an automotive electronic article, a satellite TV receiver, a computer, a telephone, a microwave, a microwave test equipment, a RF component, a RF interconnect, a power backplate, a commercial airline collision avoidance system, a beam forming network, an airborne identification system, a "friend or foe" identification system, a global positioning antenna, a global positioning receiver, a filter, a coupler, a low noise amplifier, a power divider, a combiner, a power amplifier, an automobile, a space craft, a marine craft, a medical equipment, a pipeline, a transmission device, or a monitoring device.

* * * * *